(12) United States Patent
Veloso et al.

(10) Patent No.: US 12,362,236 B2
(45) Date of Patent: Jul. 15, 2025

(54) METHOD OF PRODUCING AN INTEGRATED CIRCUIT CHIP INCLUDING A BACK-SIDE POWER DELIVERY NETWORK

(71) Applicant: IMEC VZW, Leuven (BE)

(72) Inventors: Anabela Veloso, Leuven (BE); Eric Beyne, Heverlee (BE); Anne Jourdain, Grez-Doiceau (BE)

(73) Assignee: IMEC VZW, Leuven (BE)

( * ) Notice: Subject to any disclaimer, the term of this patent is extended or adjusted under 35 U.S.C. 154(b) by 458 days.

(21) Appl. No.: 18/048,005

(22) Filed: Oct. 19, 2022

(65) Prior Publication Data

US 2023/0142597 A1   May 11, 2023

(30) Foreign Application Priority Data

Oct. 20, 2021   (EP) ..................................... 21203706

(51) Int. Cl.
| | |
|---|---|
| *H01L 21/768* | (2006.01) |
| *H01L 21/66* | (2006.01) |
| *H01L 21/78* | (2006.01) |

(52) U.S. Cl.
CPC .. *H01L 21/76877* (2013.01); *H01L 21/76802* (2013.01); *H01L 21/78* (2013.01); *H01L 22/12* (2013.01)

(58) Field of Classification Search
CPC ......... H01L 21/76877; H01L 21/76802; H01L 21/76898; H01L 21/78; H01L 21/743; H01L 23/5286
See application file for complete search history.

(56) References Cited

U.S. PATENT DOCUMENTS

| | | | |
|---|---|---|---|
| 8,158,456 B2* | 4/2012 | Chen ................. | H01L 21/76898 |
| | | | 438/459 |
| 8,987,869 B2* | 3/2015 | Jin .......................... | H01L 24/13 |
| | | | 257/E29.112 |

(Continued)

FOREIGN PATENT DOCUMENTS

EP   3 324 436 A1   5/2018

OTHER PUBLICATIONS

Extended European Search Report dated Apr. 7, 2022 in European Application No. 21203706.3.

(Continued)

*Primary Examiner* — Bac H Au
(74) *Attorney, Agent, or Firm* — Knobbe, Martens, Olson & Bear, LLP

(57) ABSTRACT

A method of producing an IC chip is provided. In one aspect, deep trenches are formed in a semiconductor layer that forms the top layer of a device wafer, the trenches going through the complete thickness of the layer. The trenches are filled with a sacrificial material, that is etched back and covered with a capping layer, thereby forming sacrificial buried rails. After processing active devices on the front surface of the semiconductor layer, including connections to the sacrificial rails, the device wafer is bonded face down to a carrier wafer, and thinned from the back side, until the sacrificial rails are exposed. The sacrificial material and the capping layer are removed and replaced by a conductive material, thereby forming the actual buried power rails. A back side power delivery network supplies power through the buried rails to the active devices of the IC. Using a sacrificial material for the buried rails can enable a wider choice of materials for these buried rails.

11 Claims, 5 Drawing Sheets

(56) References Cited

U.S. PATENT DOCUMENTS

| | | | | |
|---|---|---|---|---|
| 9,018,768 | B2* | 4/2015 | Park | .................. H01L 21/76898 |
| | | | | 257/692 |
| 10,354,980 | B1 | 7/2019 | Mushiga et al. | |
| 10,872,818 | B2* | 12/2020 | Chiang | ............. H01L 21/76831 |
| 2009/0315154 | A1* | 12/2009 | Kirby | ..................... H10D 30/60 |
| | | | | 257/E21.627 |
| 2011/0260248 | A1* | 10/2011 | Smeys | .............. H01L 21/76898 |
| | | | | 257/E21.585 |
| 2013/0175673 | A1 | 7/2013 | Jin et al. | |
| 2013/0187287 | A1* | 7/2013 | Park | .................. H01L 21/76831 |
| | | | | 257/774 |
| 2020/0027784 | A1* | 1/2020 | Park | .................. H01L 21/76805 |
| 2020/0152508 | A1 | 5/2020 | Jourdain et al. | |
| 2021/0028112 | A1* | 1/2021 | Kim | ..................... H10D 84/038 |
| 2021/0375722 | A1* | 12/2021 | Kim | ..................... H10D 84/038 |
| 2022/0020666 | A1* | 1/2022 | Van Dal | ............. H10D 30/6211 |
| 2022/0270924 | A1* | 8/2022 | La Tulipe | ......... H01L 21/76898 |
| 2022/0399224 | A1* | 12/2022 | Xie | ....................... H01L 21/743 |
| 2023/0046117 | A1* | 2/2023 | Tao | .................. H01L 21/76877 |

OTHER PUBLICATIONS

Gupta et al., "Buried Power Rail Integration with Si FinFETs for CMOS Scaling beyond the 5 nm Node", 2020 IEEE Symposium on VLSI Technology, Jun. 2020, Honolulu, Hawaii, in two pages.

Prasad et al., "Buried Power Rails and Back-side Power Grids: Arm® CPU Power Delivery Network Design Beyond 5nm", 2019 IEEE International Electron Devices Meeting (IEDM), Dec. 2019, San Francisco, California, pp. 19.1.1-19.1.4.

* cited by examiner

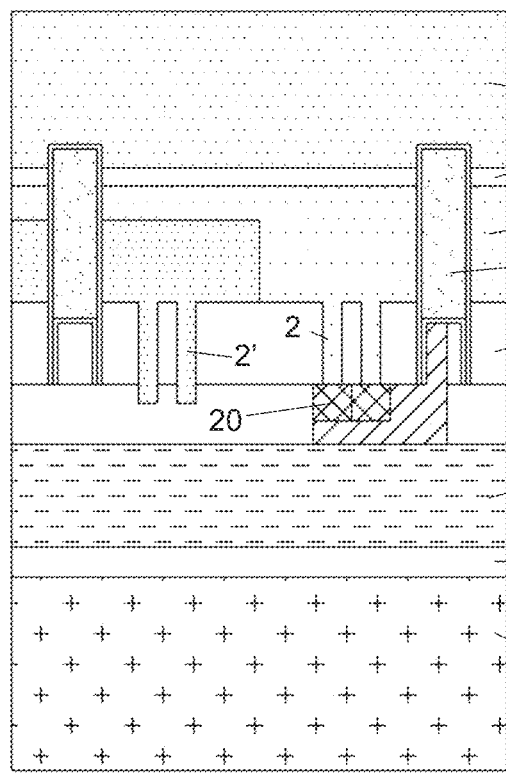
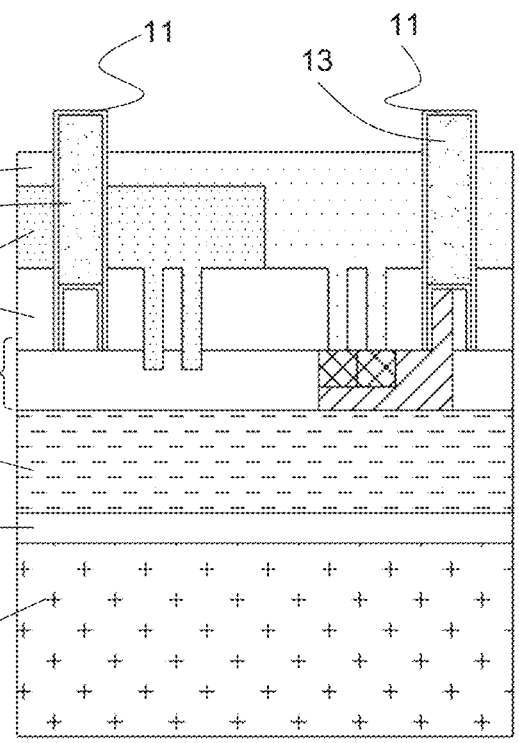
FIG. 10          FIG. 11
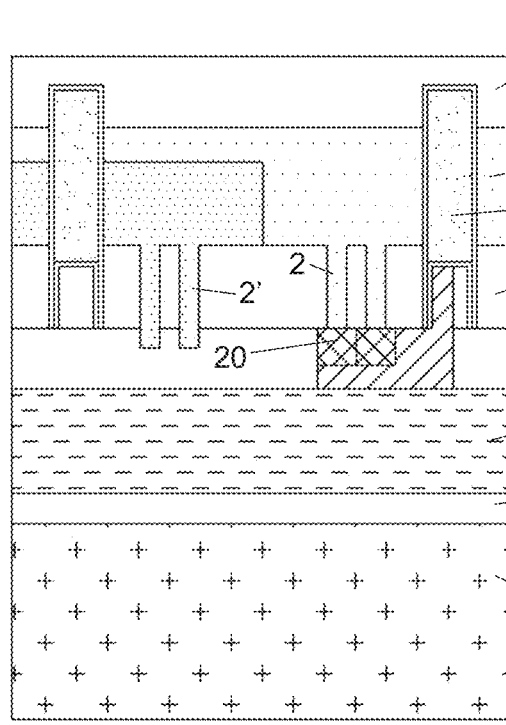
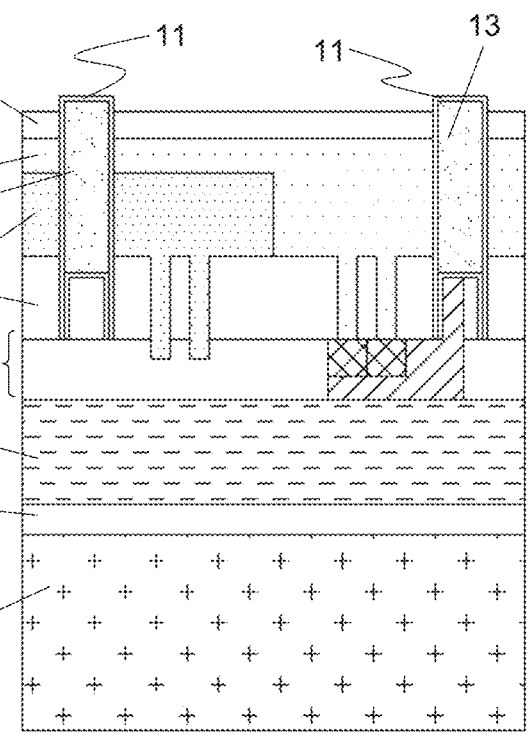
FIG. 12          FIG. 13

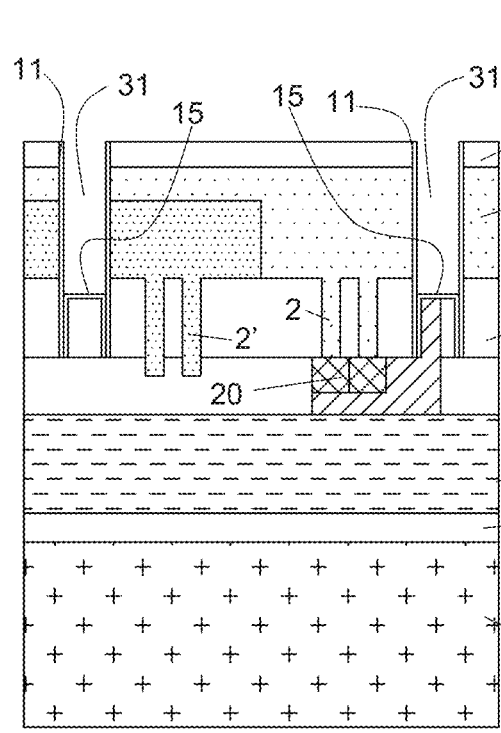
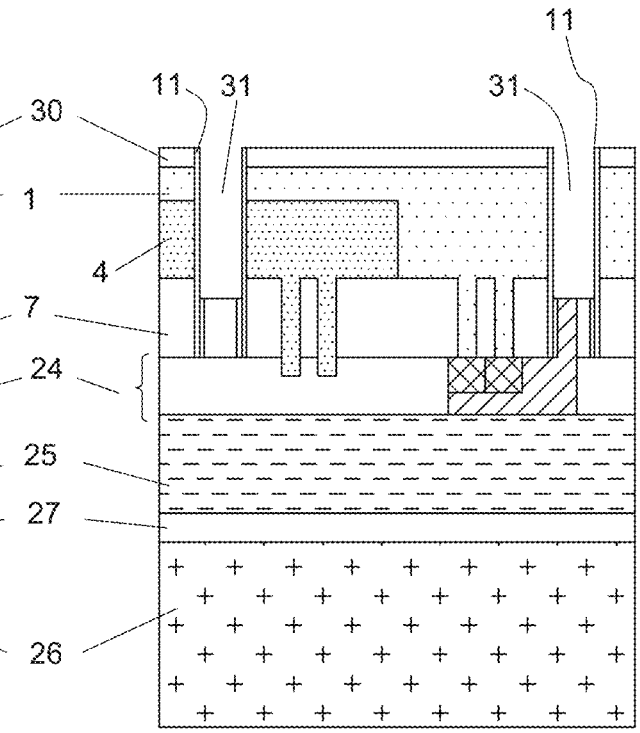
FIG. 14
FIG. 15
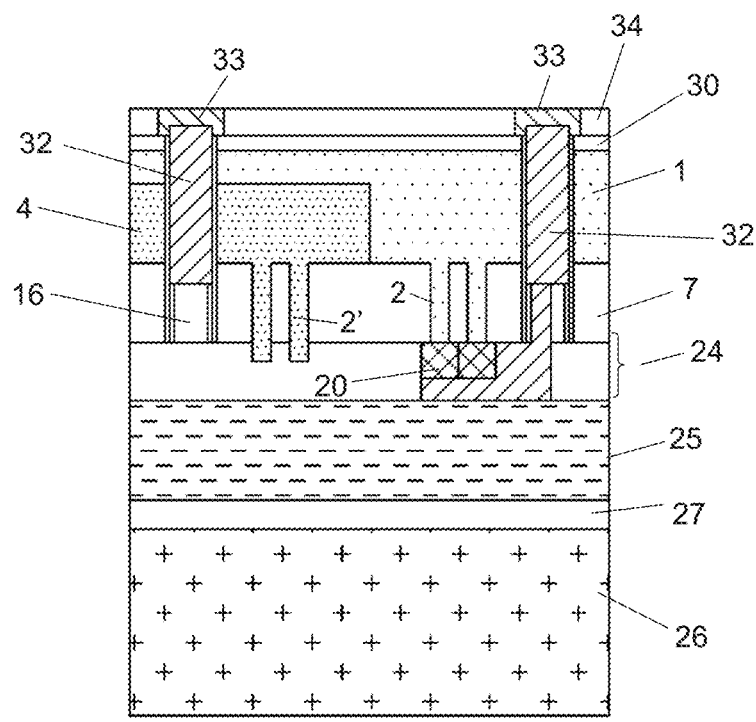
FIG. 16

METHOD OF PRODUCING AN INTEGRATED CIRCUIT CHIP INCLUDING A BACK-SIDE POWER DELIVERY NETWORK

CROSS-REFERENCE TO RELATED APPLICATIONS

This application claims foreign priority to European Application No. 21203706.3, filed Oct. 20, 2021, which is incorporated by reference herein in its entirety.

BACKGROUND

Technological Field

The disclosed technology is related to integrated circuit chips, hereafter abbreviated to ICs or IC chips, in particular to the aspect of the delivery of power to the active devices on the chip.

Description of the Related Technology

Semiconductor processing for the fabrication of integrated circuit chips continues to evolve towards increasing device-density: higher numbers of active devices (mainly transistors) of ever decreasing device dimensions are placed on a given surface of semiconductor material.

As conventional CMOS scaling is reaching its physical limits and facing increasingly constraining design restrictions, alternative solutions are sought to help preserve the overall power-performance-area-cost (PPAC) logic roadmap and continue delivering profitable node-to-node scaling gains. Buried power rails (BPR) and a back-side power delivery network (PDN) have been proposed to address interconnect congestion issues by enabling further scaling with extra routing options.

The combined application of buried power rails and a back side PDN is described, for example, in European Application Publication No. EP3324436A1. This document describes connecting buried power rails from the back side of the semiconductor layer onto which the active devices are formed. After thinning a device wafer to thereby expose the back side of the semiconductor layer, small Through Silicon Via connections (often called "nanoTSVs") are realized from the exposed back side, contacting the buried power rails. On the back surface, parallel power delivery tracks form a pattern of alternating Vdd- and Vss-coupled lines with narrow pitch.

The nanoTSVs, however, represent a restriction in terms of the resistivity of the power supply path to the active devices on the front side. Also, as buried power rails are processed from the front side of a device wafer, the material choice for these buried power rails can be limited to materials which are compatible with the thermal budget for front side processing. This can exclude a number of low-resistivity materials.

The improvement of contact resistances is another ongoing concern in the development of IC chip designs. For example, the contact resistance between nanoTSVs and back side power supply tracks can be unsatisfactory because of the material choices and dimensional restrictions related to TSV processing.

SUMMARY OF CERTAIN INVENTIVE ASPECTS

The disclosed technology aims to provide a solution to the challenges highlighted above. These and other aims are achieved by an integrated circuit chip and a method of producing an IC chip according to one or more embodiments of the disclosed technology. According to a method of the disclosed technology, deep trenches are formed in a semiconductor layer that forms the top layer of a device wafer, the trenches going through the complete thickness of the layer. The trenches are filled with a sacrificial material, that is subsequently etched back and covered with a capping layer, thereby forming sacrificial buried rails. After processing the active devices of the IC on the front surface of the semiconductor layer, including connections to the sacrificial rails, the device wafer is bonded face down to a carrier wafer, and thinned from the back side, until the sacrificial rails are exposed. The sacrificial material and the capping layer are removed and replaced by a conductive material, thereby forming the actual buried power rails. This is followed by further back side processing to form a back side power delivery network to supply power through the buried power rails to the active devices of the IC.

Using a sacrificial material for the buried rails enables a wider choice of materials for these buried rails.

The disclosed technology is in particular related to a method of producing an integrated circuit chip, including the steps of:
  providing a device wafer, including a semiconductor layer on top, the layer having a front surface and a back surface,
  producing a plurality of mutually parallel deep trenches through the complete thickness of the semiconductor layer,
  filling the trenches with a sacrificial material,
  etching back the sacrificial material to form buried rails of sacrificial material, hereafter referred to as sacrificial rails, with shallow trenches formed above the sacrificial rails,
  producing a capping layer on the inner surfaces of the shallow trenches,
  filling the shallow trenches with a dielectric material,
  producing contacts for the production of active devices on the front surface of the semiconductor layer,
  forming electrically conductive connections between a plurality of the contacts and the sacrificial rails, without removing the capping layer,
  producing the active devices, thereby forming a front end of line portion of the IC chip,
  producing a stack of interconnect layers on the active devices, thereby forming a back end of line portion of the IC chip,
  flipping the device wafer and bonding the wafer to a carrier wafer,
  thinning the device wafer from the back side thereof until the sacrificial rails protrude outward from the back surface of the semiconductor layer, wherein if necessary, the semiconductor layer itself is thinned relative to the sacrificial rails,
  depositing a dielectric layer on the back surface of the semiconductor layer, embedding the protruding portions of the sacrificial rails, and thinning the dielectric layer until the sacrificial rails are exposed,
  removing the sacrificial material, thereby forming back side trenches starting from the back surface of the dielectric layer and reaching down to the capping layer, so that the capping layer forms the bottom of the back side trenches,
  removing the capping layer from the bottom of the back side trenches, filling the back side trenches with an electrically conductive material, thereby forming buried power rails that are contacting the electrically conductive connections, planarizing the wafer until the dielectric layer and the buried power rails are exposed, producing a back side power delivery network including conductors formed on the dielectric layer for contacting the buried power rails from the back surface of the semiconductor layer, and singulating the device wafer, thereby forming the integrated circuit chip, wherein a singulated portion of the semiconductor layer forms the substrate of the IC chip, the substrate including active devices on its front surface and a power delivery network on its back surface, wherein the power delivery network is connected to the active devices through the buried power rails.

According to an embodiment, the method further includes depositing a dielectric liner on the inner surfaces of the parallel deep trenches, before depositing the sacrificial material therein.

According to an embodiment, the device wafer includes a base wafer, an etch stop layer on the base wafer, and the semiconductor layer on the etch stop layer, wherein the etch stop function of the etch stop layer is related to stopping an etch process applied during the step of thinning the device wafer from the back side thereof.

According to an embodiment, the deep parallel trenches reach into the etch stop layer.

According to another embodiment, the deep parallel trenches are formed through the complete thickness of the etch stop layer and into the base wafer.

According to an embodiment, a spectrometry method is used to monitor the depth of the trenches, as these trenches are being formed using an etch process, by detecting materials released from the semiconductor layer and from the etch stop layer.

According to an embodiment, the active devices are fin-based devices or nano-sheet based devices, wherein the buried power rails run parallel to the fins or to the nano-sheets of the active devices.

According to an embodiment, the sacrificial material is tungsten or amorphous silicon.

According to an embodiment, the capping layer is a dielectric layer.

According to an embodiment, the capping layer is a silicon nitride layer.

BRIEF DESCRIPTION OF THE DRAWINGS

The enclosed figures show illustrative embodiments of the disclosed technology. They are not drawn to scale and should not be regarded as technical drawings of real structures.

FIGS. 2 to 16 illustrate a sequence of steps illustrating one embodiment of the method of the disclosed technology.

DETAILED DESCRIPTION OF CERTAIN ILLUSTRATIVE EMBODIMENTS

In the following detailed description, a method according to the disclosed technology is described on the basis of one embodiment of the method, for producing an integrated circuit chip including a CMOS layout of finFET transistors arranged in standard cells on a semiconductor substrate. However, the disclosed technology is not limited to this particular application field. Any reference to materials used for the various layers and areas that will be described is merely intended as an example of suitable materials and is not to be understood as a limitation of the scope of the disclosed technology.

Figure 1:
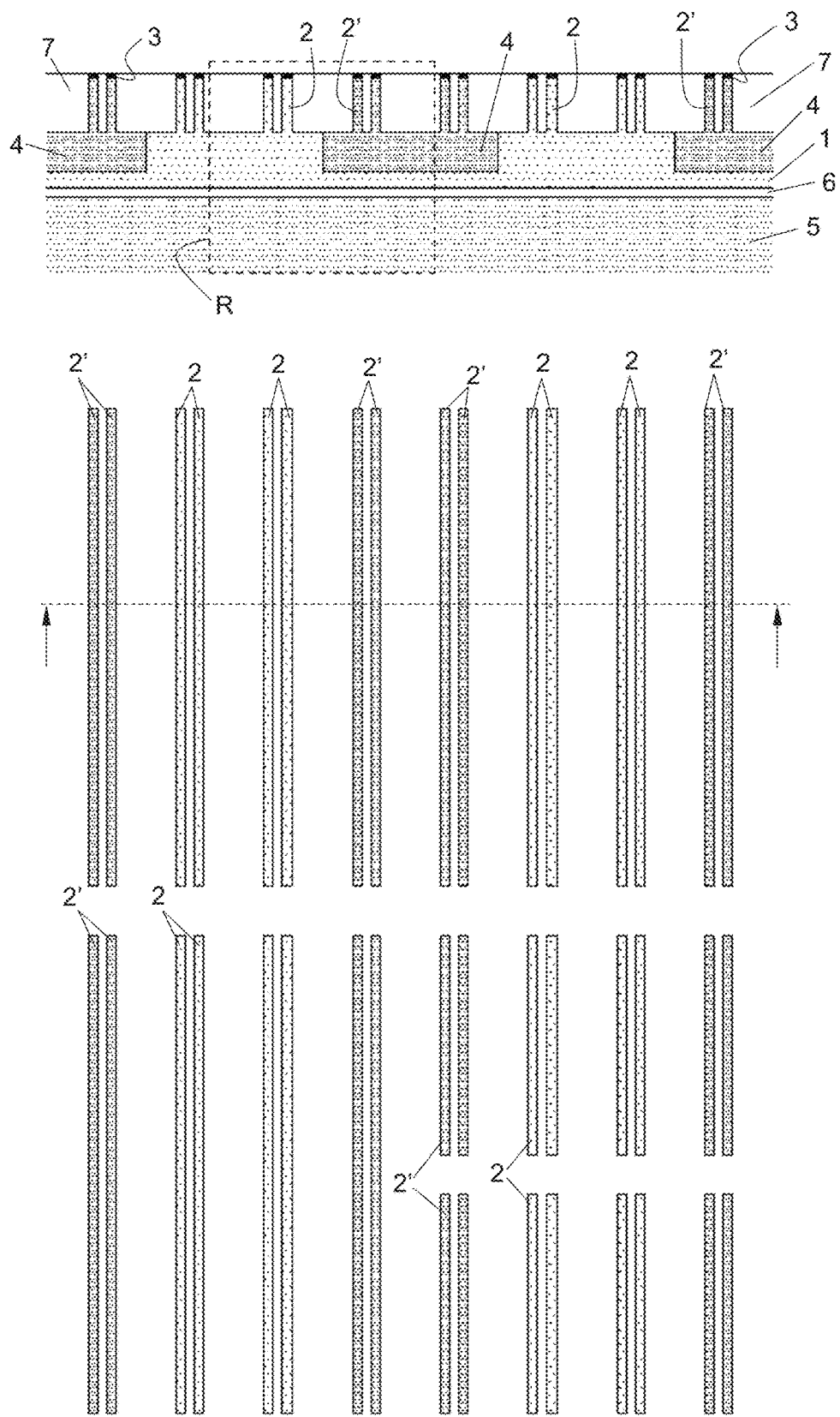
FIG. 1 shows a section view and a plane view of a portion of a device wafer including p-type fins and n-type fins, and onto which one embodiment of the method of the disclosed technology will be applied with reference to the subsequent figures.

FIG. 1 shows a small portion of a device wafer (that is, a wafer onto which active devices of IC chips are to be processed), including a monocrystalline Si layer 1, into which a number of fins 2 and 2' have been produced by a lithography and etch technique, applying etch masks 3. The width of the fins may be in the order of 10 nm or less. The two different types of hatching indicate different doping types (referred to also by respective references 2 and 2'), typically p-type and n-type doping. In the embodiment shown, the Si layer 1 could be a p-type layer, implanted with n-type dopants in well-areas 4. The well-areas 4 reach about half the depth of the Si layer 1 but could also reach to the back surface of the Si layer. The image is merely a schematic indication of the fact that adjacent p- and n-areas are created on the device wafer. This layout is typically used for producing pMOS and nMOS transistors arranged in multiple standard cells. In this example, the layout includes regularly spaced pairs of fins arranged in alternate groups of four p-type fins 2 and four n-type fins 2'. As seen in the plane view in FIG. 1, the fins are cut in their length direction in accordance with a suitable layout for an area of the IC chip that is to be processed in the area.

The Si layer 1 is a monocrystalline top layer of a multi-layer device wafer including a base wafer 5, typically a Si wafer, and a thin etch stop layer 6, which could be a SiGe layer. The Si layer 1 (including the fins) can have a thickness less than 1 µm, for example about 500 nm. The etch stop layer 6 may be a SiGe layer of about 50 nm thick for example. Its function as an etch stop layer can be to stop the etching of the base wafer 5 from the back side, as will be explained later in this description. The SiGe layer 6 and the monocrystalline Si layer 1 may be produced on a Si base wafer 5 by any suitable technique, for example by epitaxial growth methods. An alternative would be to use a silicon-on-insulator (SOI) wafer, wherein the insulator layer plays the part of etch stop layer later in the process. The fins 2, 2' are embedded in a layer 7 of dielectric material. Typically, this is a layer of silicon oxide ($SiO_2$), also referred to as "shallow trench isolation" oxide. We will hereafter refer to this layer as the STI layer 7. Layer 7 may be applied by any suitable technique, and may include a densification anneal step applying a thermal budget that is compatible with the material of the etch stop layer 6. The STI layer 7 may include a liner that follows the topography of the fins, for example a thin SiN layer, with a $SiO_2$ deposited on top of the SiN layer.

Figure 2:
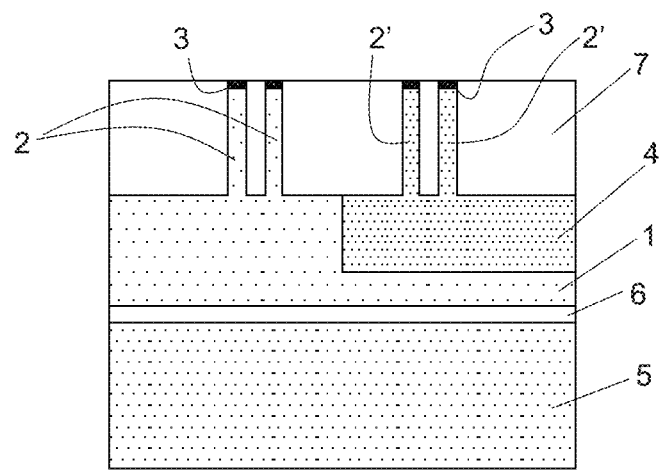

FIG. 2 is an enlarged image of the part of the section view of FIG. 1 indicated by the rectangle R, including two p-type fins 2 and two n-type fins 2'. In a step of an example method of the disclosed technology and as illustrated on the basis of two alternative embodiments illustrated in FIGS. 3A and 3B, deep trenches 10 are etched by anisotropic etching through the complete thickness of the Si layer 1, in the areas between consecutive pairs of fins of the same type in FIG. 1, that is, on either side of the two pairs of fins shown in FIG. 2. In their length direction, the trenches 10 span across a given area of the fin layout of which a part is shown in the plane view of FIG. 1. The width of the trenches 10 is shown to be significantly larger than the width of the fins 2, 2' but this is mostly in order to be able to clearly show a number of aspects of the example method below. In reality the trenches 10 could be narrower than shown in the drawings.

Figure 3A:
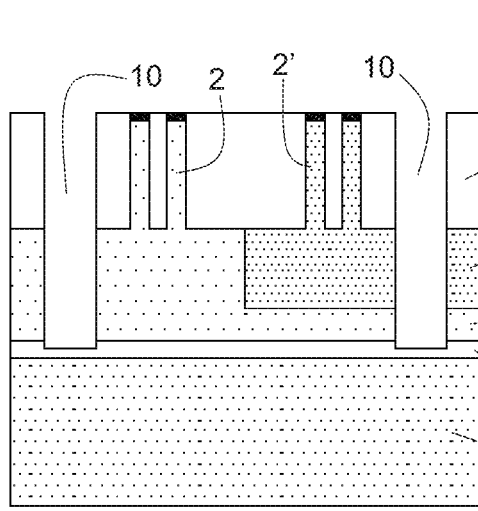
Figure 3B:
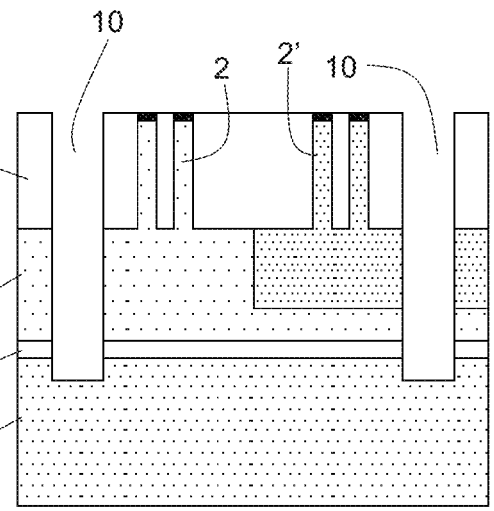

The trenches 10 may reach into the SiGe layer 6 as illustrated in FIG. 3A or pass through the SiGe layer 6 and partially into the base wafer 5, as illustrated in FIG. 3B. The formation of these trenches is can be realized by lithography and etch techniques.

It is to be noted that while the SiGe layer 6 is described as an etch stop layer, the etch stop function does not refer in the first place to etch recipes for producing the trenches 10. So, while it would be possible to use a first etch recipe for etching Si selectively to SiGe (for example, an etch process that stops on the SiGe layer 6 and thereafter another etch recipe that allows to continue the etch process into and possibly through the SiGe layer 6), it is also possible to use an etch recipe that removes both Si and SiGe.

According to an embodiment, such an etch recipe that removes both Si and SiGe can be used, and the material that is released from the Si layer 1 and from the SiGe layer 6 during the etch process is monitored by spectrometry as the etch progresses, so that the time may be detected when the SiGe layer 6 is reached. The etch process could then be stopped or continued further into the SiGe layer (as in FIG. 3A), or fully through the SiGe layer and into the base wafer 5 (as in FIG. 3B).

Alternatively, a timed etch can be applied, wherein the etch time is determined beforehand based on the etch speeds and the dimensions of the etched areas. The spectrometry-based approach, however, enables to obtain a more accurate control of the depth of the trenches 10. This spectrometry-based monitoring has not been used in this particular context, that is, for controlling the etch depth of trenches applied for the purpose of producing buried power rails of an IC chip. The approach is possible here because the trenches 10 are etched through the complete thickness of the semiconductor layer 1, whereas prior techniques include etching only partially into the layer 1 and possibly locally continuing the etch to form via openings to the back of the layer 1. Without being bound to any particular theory, as the trenches are now etched entirely through the thickness of the semiconductor layer 1, it is believed that the amount of released material is sufficient to enable the spectrometry-based monitoring approach described above. Any suitable spectrometry equipment configured to detect the materials in question could be used for this purpose.

Figure 4:
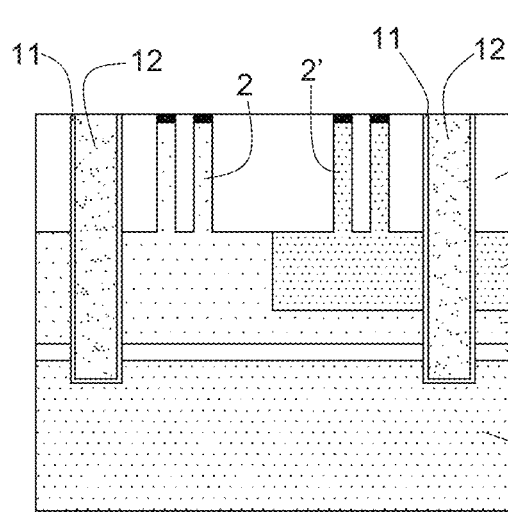

The description of the method is continued in FIG. 4, using the alternative shown in FIG. 3B, that is, trenches etched completely through the SiGe layer 6 and into the base wafer 5. A dielectric liner 11 is formed on the inner surfaces of the trenches 10, that is, on the bottom and the sidewalls. This could be a layer of titanium nitride formed by atomic layer deposition (ALD). The thickness of the liner 11 can be in accordance with thicknesses generally applied for dielectric liners formed around buried power rails to isolate the rails from the surrounding material.

Then, the trenches 10 are filed with a sacrificial material 12, that is, a material that is to be removed again later in the process. The upper surface of the device wafer is then planarized using any suitable planarization technique, such as CMP (chemical mechanical polishing), resulting in the image shown in FIG. 4. The sacrificial material 12 can be a metal, such as tungsten (W), deposited by ALD or chemical vapor deposition, or a non-metal, such as amorphous silicon.

Figure 5:
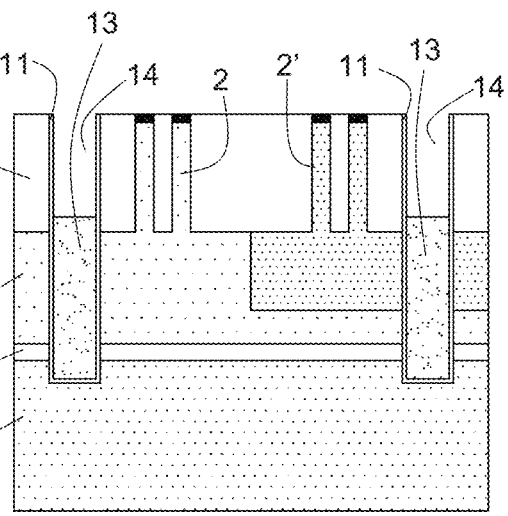

With reference to FIG. 5, the sacrificial material is then etched back from the front side of the device wafer, for example (and as shown in the drawings) to just above the base of the fins 2, 2'. In general, the remaining thickness of sacrificial material corresponds to a suitable thickness for the buried power rails that will ultimately replace the sacrificial material. The remaining volumes of the sacrificial material will be referred to as "sacrificial rails" 13. After etching back the sacrificial material, shallow trenches 14 (meaning shallower than the original trenches 10) appear above the sacrificial rails 13.

Figure 6:
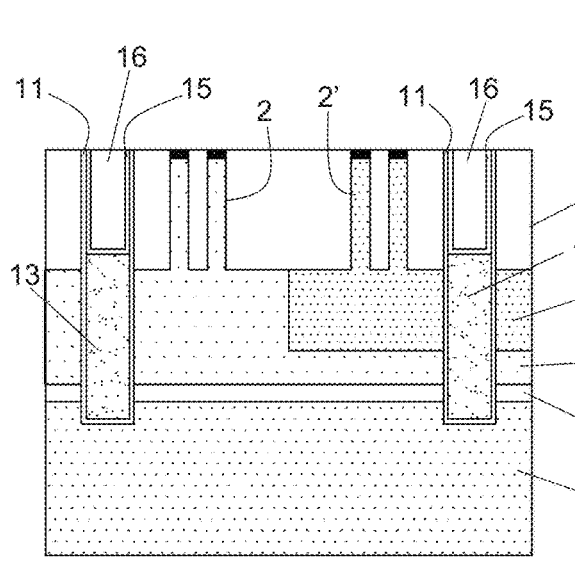

In the next step, illustrated in FIG. 6, a capping layer 15 is applied on the inner surfaces of the shallow trenches 14, that is, on the bottom and sidewalls thereof. The capping layer 15 can be a dielectric layer and could be a thin SiN layer applied, for example, by ALD. The thickness of the capping layer 15 is in the same order of magnitude as the thickness of the dielectric liner 11. The function of the capping layer 15 can be to protect the sacrificial rails 13 during front side processing applied for producing active devices and connections from these devices to the sacrificial rails (described further below). Any material that is suitable for performing this function can be used as the capping layer. The capping layer can thus enable the full decoupling of the front side processing steps from the formation of the actual buried rails (described further below), so that a wider choice of materials for these rails becomes available.

The shallow trenches 14 are then filled with a dielectric material 16, possibly this may be the same material as the STI layer 7, for example $SiO_2$, applied by the same method that may include a densification anneal compatible with the SiGe etch stop layer 6, and the wafer is again planarized, resulting in the view shown in FIG. 6.

Figure 7:
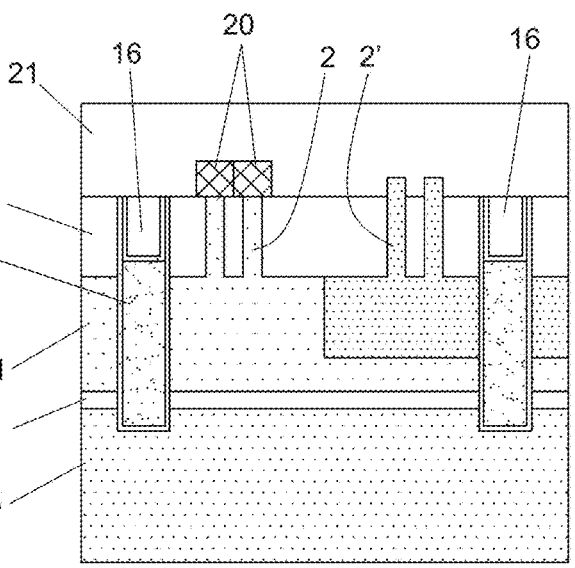

Then a number of CMOS process steps can be performed, of which the result is illustrated in a simplified way in FIG. 7. This is the processing of source or drain (S/D) contacts 20 of transistors on the fins 2, 2', in accordance with a given layout of standard cells arranged between the sacrificial rails 13. The STI layer 7 can be etched back to expose the top of the fins, and the S/D contacts 20 can be formed thereon, for example by epitaxial techniques. Contacts are shown only on the p-type fins 2 in the drawing. The n-type fins may equally be provided with contacts lying outside the plane of the drawing. Additional steps for forming transistors or other active devices are performed, such as gate processing steps (not shown). The active devices are covered by another dielectric layer 21 followed by a planarization step.

Figure 8:
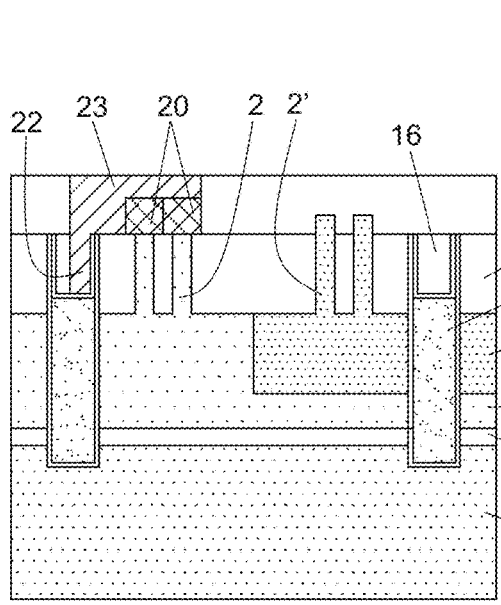

FIG. 8 shows the result of additional process steps, which in some cases are performed when buried power rails are already present in the Si layer 1, as opposed to the sacrificial rails 13 formed according to the example method of the disclosed technology. These process steps can be referred to as the formation of a "VBPR" (via to buried power rail (BPR)) 22 and MOA connection 23 (electrically conductive connection to S/D contacts). In the drawings, the VPBR and the MOA are drawn as one integral area, and it is in fact possible to form this area in one deposition step. However, the VBPR and the MOA can also be formed in separate steps. Such steps can implement any suitable technique and are therefore not detailed here. For example, lithography and etch steps can be performed for forming cavities corresponding to the VBPR and MOA areas, and filling of the cavities with an electrically conductive material, for example metal, after which the wafer's top surface is planarized. In FIG. 8, the top area of the device wafer at this stage of the method is referred to as the front end of line portion 24 of the IC. The "{" is merely an indicative sign of the location of the FEOL portion 24, without meaning to define an exact border.

Figure 9:
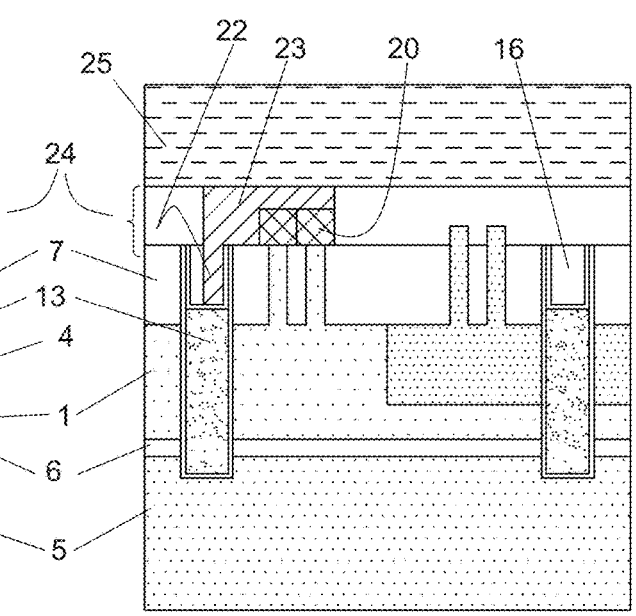

As shown in FIG. 9, the method continues with the formation of the BEOL portion 25, the latter being a stack of interconnects including several metallization levels (M1, M2, etc.), including a passivation layer on top (not shown). The MOA connections 23 are indicated as part of the front end of line portion 24 in the drawings. They could, however, be regarded as part of the BEOL portion 25 (described further below). Embodiments of the disclosed technology include both options.

Back side processing is now performed, after flipping the wafer and bonding it to a carrier wafer 26, for example by applying dielectric bonding layers 27 (shown as one bonded layer in the drawings) to the carrier 26 and to the BEOL stack 25, as illustrated in FIG. 10.

The base wafer 5 is removed by a thinning sequence that may include etching and/or grinding steps, ending with a highly selective etch step, for example a wet etch in the case of a SiGe etch stop layer 6, that effectively stops when reaching the SiGe layer 6. Such highly selective etch recipes are suitable for the selective etch of Si relative to SiGe, as well as for other material combinations. Following this, the etch stop layer 6 itself is removed, resulting in the situation illustrated in FIG. 11, with the sacrificial rails 13, including the liner 11, protruding outward from the back surface of the Si layer 1. If necessary, the material of the Si layer 1 is slightly recessed in order to obtain this result.

A dielectric layer 30 (for example, $SiO_2$) is deposited on the wafer and planarized (see FIG. 12), and thereafter etched back to expose a portion of the sacrificial rails 13. As shown in FIG. 13, the portion may protrude from the dielectric layer 30. Using etch recipes with the required selectivity, the liner 11 is removed from the protruding portion of the rails 13, and the sacrificial rails 13 themselves are removed relative to the liner 11 and the capping layer 15, resulting in the view shown in FIG. 14. If the sacrificial rails 13 are formed of tungsten (W), the tungsten may be removed using an APM (ammonia peroxide mixture) solution. The removal of the sacrificial rails results in trenches 31 formed through the back surface of the Si layer 1, with the capping layer 15 forming the bottom of these back side trenches 31.

With reference to FIG. 15, the capping layer 15 is then removed from the bottom of the trenches 31, which may be done by a dry or wet etch process, that is likely to also thin the dielectric layer 30 on the back surface of the Si layer. The initial thickness of the dielectric layer 30 in the view shown in FIG. 13 must therefore be sufficient in order for this layer not to be removed completely when the capping layer 15 is removed from the bottom of the back side trenches 31.

Thereafter, the back side trenches 31 are filled with an electrically conductive material, for example a metal, followed by planarizing the back surface, as shown in FIG. 16, thereby forming the conductive buried power rails 32 which are electrically connected to the VBPRs 22 and thereby to the MOA connections 23, that is, to the active devices on the front surface of the Si layer 1. The choice of the material for the power rails 32 is much more free compared to the other methods, in which the power rails are formed prior to the formation of the FEOL and BEOL portions of the IC. Embodiments of the disclosed technology allow a choice of materials with lower resistivity compared to prior devices.

Metallization steps are then performed on the back side to form the back side power delivery network, starting, for example, with the formation of metal tracks 33 connected to the power rails (see FIG. 16, showing these tracks embedded in a dielectric layer 34). Through additional interconnect layers of the PDN (not shown), these tracks can be connected to power supply terminals from which power may be supplied, through the PDN and the power rails 32, to the active devices arranged in standard cells between the power rails 32. Before forming the metal tracks 33, the dielectric layer 30 could be recessed relative to the power rails 32, which enables the contact surface between the rails and the tracks to be increased.

Further steps to produce the actual IC chips can be performed, and are not described in detail. Such steps can include singulating the device wafer, for example by cutting or sawing, to obtain separate IC chips.

The disclosed technology is not limited to an IC including fin-based devices. Methods of the disclosed technology can be applied in the production of any type of known active devices on the front surface of the Si layer 1. The devices could be nano-sheet based devices, wherein stacks of nano-sheets are processed on the front surface of the Si layer 1, the stacks having a similar profile to the fins 2 and 2' shown in the drawings.

While the disclosed technology has been illustrated and described in detail in the drawings and foregoing description, such illustration and description are to be considered illustrative or exemplary and not restrictive. Other variations to the disclosed embodiments can be understood and effected by those skilled in the art. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The foregoing description details certain embodiments of the disclosed technology. It will be appreciated, however, that no matter how detailed the foregoing appears in text, the disclosed technology may be practiced in many ways, and is therefore not limited to the embodiments disclosed. It should be noted that the use of particular terminology when describing certain features or aspects of the disclosed technology should not be taken to imply that the terminology is being re-defined herein to be restricted to include any specific characteristics of the features or aspects of the disclosed technology with which that terminology is associated.

Unless specifically specified, the description of a layer being present, deposited or produced "on" another layer or substrate, includes the options of:

the layer being present, produced or deposited directly on, that is, in physical contact with, the other layer or substrate, and the layer being present, produced or deposited on one or a stack of intermediate layers between the layer and the other layer or substrate.

What is claimed is:

1. A method of producing an integrated circuit (IC) chip, comprising:

providing a device wafer comprising a semiconductor layer on top, the layer having a front surface and a back surface;

producing a plurality of mutually parallel deep trenches through a complete thickness of the semiconductor layer;

filling the trenches with a sacrificial material;

etching back the sacrificial material to form buried rails of sacrificial material (sacrificial rails), with shallow trenches formed above the sacrificial rails;

producing a capping layer on inner surfaces of the shallow trenches;

filling the shallow trenches with a dielectric material;

producing contacts for production of active devices on the front surface of the semiconductor layer;

forming electrically conductive connections between a plurality of the contacts and the sacrificial rails, without removing the capping layer;

producing the active devices thereby forming a front end of line portion of the IC chip;

producing a stack of interconnect layers on the active devices, thereby forming a back end of line portion of the IC chip;

flipping the device wafer and bonding the wafer to a carrier wafer;

thinning the device wafer from a back side thereof until the sacrificial rails protrude outward from the back surface of the semiconductor layer;

depositing a dielectric layer on the back surface of the semiconductor layer, embedding the protruding portions of the sacrificial rails, and thinning the dielectric layer until the sacrificial rails are exposed;

removing the sacrificial material, thereby forming back side trenches starting from the back surface of the dielectric layer and reaching down to the capping layer, so that the capping layer forms a bottom of the back side trenches;

removing the capping layer from the bottom of the back side trenches;

filling the back side trenches with an electrically conductive material, thereby forming buried power rails that are contacting the electrically conductive connections;

planarizing the wafer until the dielectric layer and the buried power rails are exposed;

producing a back side power delivery network including conductors formed on the dielectric layer for contacting the buried power rails from the back surface of the semiconductor layer; and singulating the device wafer thereby forming the integrated circuit chip, wherein a singulated portion of the semiconductor layer forms a substrate of the IC chip, the substrate comprising active devices on its front surface and a power delivery network on its back surface, wherein the power delivery network is connected to the active devices through the buried power rails.

2. The method according to claim 1, further comprising depositing a dielectric liner on the inner surfaces of the parallel deep trenches, before depositing the sacrificial material therein.

3. The method according to claim 1, wherein the device wafer comprises a base wafer, an etch stop layer on the base wafer, and the semiconductor layer on the etch stop layer, wherein an etch stop function of the etch stop layer is related to stopping an etch process applied during thinning of the device wafer from the back side thereof.

4. The method according to claim 3, wherein the deep parallel trenches reach into the etch stop layer.

5. The method according to claim 4, comprising using spectrometry to monitor a depth of the trenches, as these trenches are being formed using an etch process, by detecting materials released from the semiconductor layer and from the etch stop layer.

6. The method according to claim 3, wherein the deep parallel trenches are formed through a complete thickness of the etch stop layer and into the base wafer.

7. The method according to claim 1, wherein the active devices are fin-based devices or nano-sheet based devices, and wherein the buried power rails run parallel to the fins or to the nano-sheets of the active devices.

8. The method according to claim 1, wherein the sacrificial material is tungsten or amorphous silicon.

9. The method according to claim 1, wherein the capping layer is a dielectric layer.

10. The method according to claim 9, wherein the capping layer is a silicon nitride layer.

11. The method according to claim 1, wherein thinning the device wafer from the back side thereof comprises thinning the semiconductor layer relative to the sacrificial rails.

* * * * *